United States Patent [19]

Simmonds

[11] 4,403,189

[45] Sep. 6, 1983

[54] SUPERCONDUCTING QUANTUM INTERFERENCE DEVICE HAVING THIN FILM JOSEPHSON JUNCTIONS

[75] Inventor: Michael B. Simmonds, Del Mar, Calif.

[73] Assignee: S.H.E. Corporation, San Diego, Calif.

[21] Appl. No.: 180,690

[22] Filed: Aug. 25, 1980

[51] Int. Cl.³ .......................................... G01R 33/035
[52] U.S. Cl. ..................................... 324/248; 307/306
[58] Field of Search ........................... 324/248; 357/5; 307/306; 331/107 S; 335/216

[56] References Cited

U.S. PATENT DOCUMENTS

| | | | |
|---|---|---|---|
| 3,445,760 | 5/1969 | Zimmerman | 307/306 X |
| 3,573,661 | 4/1971 | McCumber | 331/107 S |
| 3,723,755 | 3/1973 | Morse | 324/248 X |
| 3,758,854 | 9/1973 | Zimmerman | 324/248 |
| 3,962,628 | 6/1976 | Rein | 324/248 |
| 4,320,341 | 3/1982 | Lutes | 324/248 |

*Primary Examiner*—Gerard R. Strecker
*Attorney, Agent, or Firm*—Christie, Parker & Hale

[57] ABSTRACT

Thin film Josephson junctions are combined with a block of superconductive material to form a low inductance dc SQUID having very high sensitivity. The block has a toroidal cavity with a circular opening or gap between the cavity and one face of the block. A pair of Josephson junctions, using planar thin film technology, are formed on a substrate and clamped against the block so that the two junctions in series bridge the gap, the junctions and the block combining to form a superconductive closed loop with two junctions in the loop. Coils in the toroidal cavity are inductively coupled to this closed loop.

6 Claims, 3 Drawing Figures

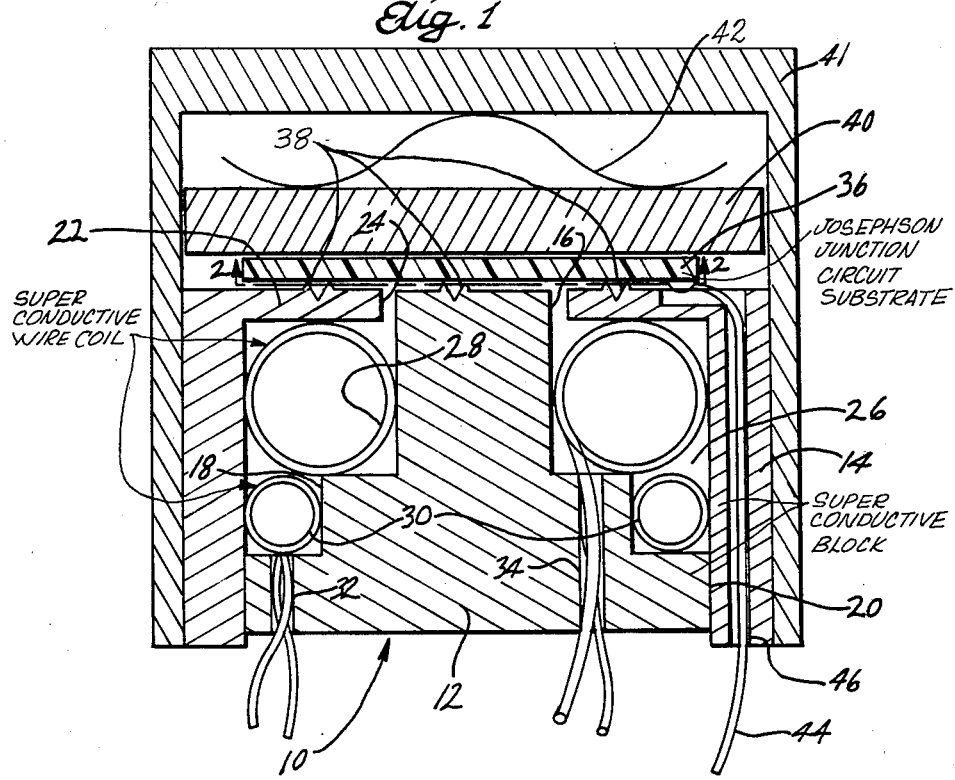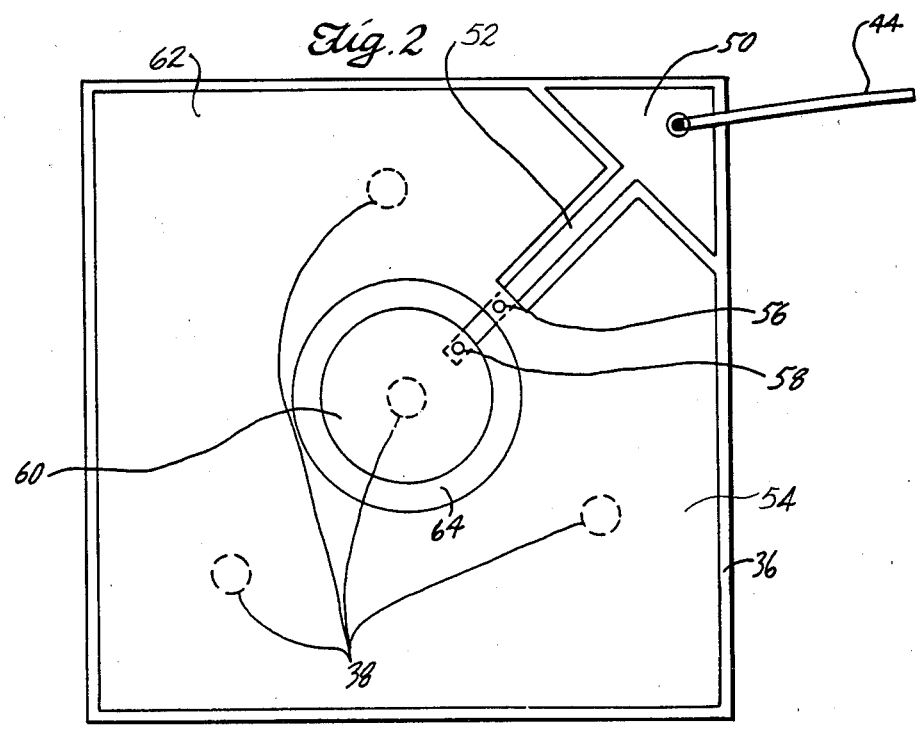

SUPERCONDUCTING QUANTUM INTERFERENCE DEVICE HAVING THIN FILM JOSEPHSON JUNCTIONS

FIELD OF THE INVENTION

This invention relates to a superconducting guantum interference device, known as a SQUID, and more particularly, to a SQUID construction using planar thin film Josephson junctions.

BACKGROUND OF THE INVENTION

The use of SQUIDS as sensors to measure magnetic fields or small voltages is well known. SQUID sensors have generally been of two types commonly referred to as RF SQUID and dc SQUID. The RF SQUID utilizes a single Josephson junction in a closed superconductive loop. The dc SQUID requires two Josephson junctions connected in a closed superconductive loop with a dc bias connected across the two junctions in parallel. RF SQUIDS have been constructed by forming a toroidal chamber with a small gap left in the central post of the toroid. The Josephson junction is formed by a pointed screw bridging the gap and forming a weak conductive link. One or more coils wound from superconducting wire within the toroidal chamber magnetically couple to the current circulating in the closed loop through the junction. While such a device can be built with a high coefficient of coupling and with very low inductance formed by the SQUID body as well as relatively high coil inductance to match well to current source impedances, this design does not lend itself to use with dc SQUIDS. While in principle it is possible to use point contact, weak link Josephson junctions in a dc configuration, it is impractical to adjust the two junctions accurately enough to achieve the uniformity of design required for a commercially acceptable product.

For this reason, dc SQUIDS in the past have employed Josephson junctions using thin film semi-conductor junctions. By using semi-conductor techniques and technology, which is now highly developed, repeatability and fabrication can be more readily achieved. However, because of their inherent planar geometry, SQUID devices using thin film junctions do not lend themselves to obtaining a high coefficient of coupling, low inductance in the junction loop, and high inductance in the coupling coil that is desired.

SUMMARY OF THE INVENTION

The present invention is directed to an improved SQUID design which is particularly suited to use as a dc SQUID sensor, although it may be designed for a single junction RF SQUID. The present invention provides a SQUID which uses planar thin film Josephson junctions in combination with a superconducting block forming the major portion of the superconducting loop. The block has a toroidal chamber with a circular gap in one face of the block communicating with the chamber and dividing the surface of the block into two concentric pad areas. A pair of junctions formed on a substrate bridge the gap and make contact with the pad areas to complete a very low inductance superconducting loop with the block. Coils of superconducting material are mounted in the toroidal chamber which inductively couple to the closed conductive loop formed by the block and containing the two junctions. A conducting lead is attached to the thin film at the point located electrically between the two junctions for operation of the device as a dc SQUID.

BRIEF DESCRIPTION OF THE DRAWINGS

For a better understanding of the invention, reference should be made to the accompanying drawings, wherein:

FIG. 1 is a cross-sectional view of the SQUID design of the present invention;

FIG. 2 is a sectional view taken on the line 2—2 of FIG. 1 showing a surface of the printed circuit and junctions.

DETAILED DESCRIPTION

Figure 3:
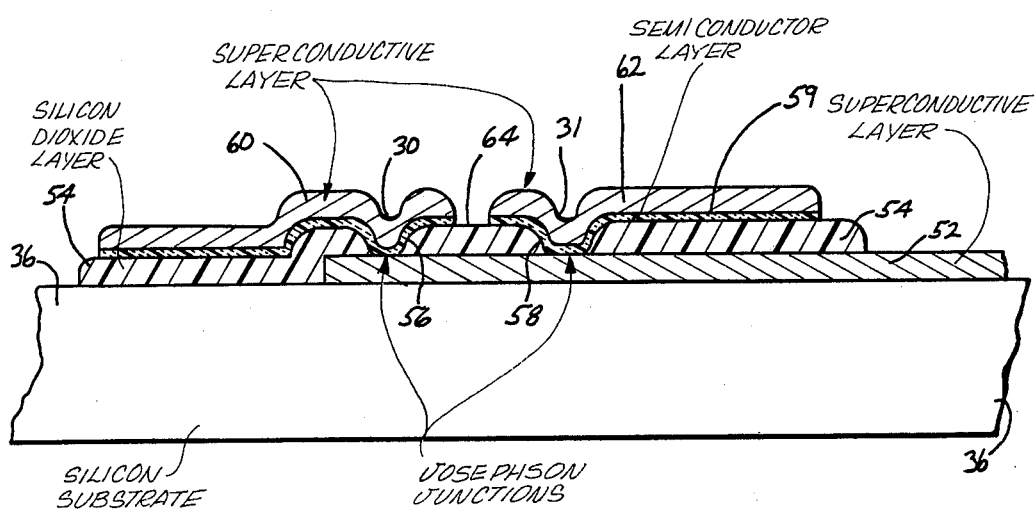
FIG. 3 is a detail partial sectional view taken on the line 3—3 of FIG. 2.

Referring to the drawings in detail, the SQUID comprises a block 10 of superconductive material such as niobium constructed from two pieces, an inner piece 12 and an outer piece 14. The inner piece 12 is preferably cylindrical in form and has a small diameter end 16, an intermediate diameter portion 18 and an outer cylindrical portion 20. The outer piece 14 of the block 10 is tubular in shape and closed at one end by an end wall 22 having a central opening 24 of slightly larger diameter than the inner cylindrical portion 16 of the inner piece 12. The inner piece 12 may be press fitted into the piece 14. Thus an annular or toroidal chamber 26 is formed having an upper larger region and a lower smaller region. A pair of toroidal-shaped coils 28 and 30 wound from insulated superconductive wire are positioned respectively in the larger upper section of the chamber and the smaller lower section of the chamber. Superconductive leads to the coils 28 and 30 are brought out respectively through holes 32 and 34 extending through the inner piece 12 of the block. The region in and around the coils is filled with epoxy after assembly.

A pair of thin film Josephson junctions are formed on a substrate 36 positioned on top of the superconductive block 10. Conducting films on the surface of the substrate 36 are in direct contact with the top surface of the block 10. To insure good electrical contact between the conductive films and the block, the top surface of the inner piece 12 and the end wall 22 of the outer piece 14 of the block are lapped smooth and then dimpled, as indicated at 38. The dimples are formed by lightly tapping a hardened pointed punch against the surface of the material forming the superconductive block 10. This dimpling forms a small circular projecting ridge at each dimple which makes contact with the conductive film on the substrate 36. This ridge is approximately 0.002 inches high and 0.010 inches in diameter. The substrate is clamped in position against the ridges by a ceramic backing plate 40 to form a low inductance superconducting contact between the block and the thin conductive film of the junctions. The entire assembly is enclosed in an outer cup-shaped rigid frame 41. Suitable spring means, such as indicated at 42, ensures that the thin film assembly is clamped securely in place. An electrical lead 44 of superconductive material is brought out through an opening 46 in the tubular member 14 from a terminal on the surface of the Josephson junction element.

Referring to FIGS. 2 and 3, the thin flim Josephson junction assembly is shown in detail. It should be noted that the film layers shown on the surface of the substrate in FIG. 3 are greatly exaggerated in thickness to make them legible in the drawing. The substrate 36 may be made of silicon or other suitable nonconductive material on which is provided a first conductive layer or film 50 that is substantially triangular in outline and extends across one corner of the substantially square substrate. The layer 50 includes an elongated strip 52 which extends diagonally toward the center of the substrate. This strip is overlain at least for a portion of its length by a nonconductive silicon dioxide layer 54. Two small openings or orifices in this silicon dioxide layer expose the conductive layer strip 52, as indicated at 56 and 58. The silicon dioxide layer 54 adjacent the holes 56 and 58 is overlain with a layer 59 of doped semiconductor material such as silicon to form a junction "barrier." Finally, two additional conductive layers 60 and 62 are formed on top of the semiconductor barrier layer 59. The conductive layers 60 and 62 are separated by an annular or circular gap 64 which extends concentrically around the center of the substrate and is positioned substantially coaxially with the gap formed between the opening 24 and inner section 16 of the superconductive block 10. The gap 64 extends between the junctions formed at the openings 56 and 58 in the silicon dioxide layer 54. It should be noted that all three conductive layers 52, 60 and 62 are made of superconductive material such as niobium. The layers 60 and 62 are in contact with the inner and outer pieces of the superconductive block 10. The position of the dimples 38 is indicated by the dotted circles in FIG. 2.

The materials used in the preferred embodiment of the thin film structure are silicon for the substrate which is approximately 0.01 inches thick by 0.15 inches square. This silicon chip is bonded to the rigid ceramic plate 40 for additional support. The thin conductive films 60, 62 and 52 are made of sputtered niobium approximately 1500 angstroms thick. The barrier layer 59 is made of silicon approximately 200 angstroms thick. Such junction configurations and barrier compositions are well known.

The inductance of the SQUID loop in the preferred embodiment is of the order of $3 \times 10^{-10}$ Henry. The signal coil 28 and the modulation coil 30 have an inductance of approximately $5.5 \times 10^{-7}$ Henry. By eliminating one of the junctions and the lead 44, the device can be operated as an RF SQUID. When operated as a dc SQUID, a bias current slightly in excess of the critical current of the two junctions passes through the two junctions in parallel through the lead 44 and the block 10.

What is claimed is:

1. A SQUID comprising: a block of superconducting material having a toroidal chamber surrounding a central post, the block having an opening into the chamber, the post terminating in said opening and forming an annular gap; toroidal coil means in said chamber extending around the post, the coil having a pair of terminals extending outside the block for connecting the coil to an external circuit; and thin-film junction means including a non-conductive substrate, first and second superconductive layers on said substrate, a portion of the two layers overlapping with a semiconductive layer positioned between the overlapping portions to form a Josephson junction, the substrate being positioned against said one face of the block with the second layer being in contact with the post in the region surrounded by the annular gap and the first layer being in electrical contact with said face of the block in region outside the annular gap.

2. Apparatus of claim 1 wherein said conductive means includes a third superconductive layer, a portion of the second and third layers overlapping with a semiconductive layer positioned between the overlapping portions to form a second Josephson junction, the third layer being in electrical contact with the block in the region surrounded by the circular gap.

3. Apparatus of claim 2 wherein the surface of the block having the circular gap into the toroidal chamber is a planar surface, and the conductive layers of the thin film junction means are substantially planar, the surface of the block having ridges making contact with said conductive layer surfaces.

4. Apparatus of claim 3 wherein said ridges are dimples formed in the planar surface of the block, the ridges being circular.

5. A SQUID comprising: a block of conducting material having an open toroidal cavity surrounding a central post, the post and open cavity forming an annular opening in one side of the block, thin film junction means including a non-conductive substrate having first and second superconductive regions formed on the substrate and thin film Josephson junction means connecting the two regions, the substrate overlying said one side of the block, one of said superconductive regions being in electrical contact with the central post and the other superconductive region being in contact with the block adjacent the outer edge of the annular opening, and a toroidal conductive coil extending around the post in said cavity, the coil having a pair of terminals extending outside the block.

6. Apparatus of claim 5 wherein said block and post are made of superconducting material.

* * * * *